(12) United States Patent
Roth

(10) Patent No.: US 7,129,695 B2
(45) Date of Patent: Oct. 31, 2006

(54) ELECTRICAL TEST CIRCUIT WITH AN ACTIVE-LOAD AND AN OUTPUT SAMPLING CAPABILITY

(76) Inventor: Bernhard Roth, Calmbacher Str. 158, 71034 Boeblingen (DE)

( * ) Notice: Subject to any disclaimer, the term of this patent is extended or adjusted under 35 U.S.C. 154(b) by 0 days.

(21) Appl. No.: 10/864,123

(22) Filed: Jun. 9, 2004

(65) Prior Publication Data

US 2005/0007180 A1    Jan. 13, 2005

(30) Foreign Application Priority Data

Jun. 27, 2003   (EP) .................................. 03101930

(51) Int. Cl.
  *G01R 15/12*   (2006.01)
  *G01R 31/28*   (2006.01)
(52) U.S. Cl. .................. 324/158.1; 324/765; 324/73.1
(58) Field of Classification Search ............ 324/158.1, 324/73.1, 760–765; 327/294, 91–96; 714/724
  See application file for complete search history.

(56) References Cited

U.S. PATENT DOCUMENTS

| | | | |
|---|---|---|---|
| 3,075,086 A  *  | 1/1963 | Mussard  ..................... | 327/494 |
| 4,583,223 A  *  | 4/1986 | Inoue et al. ................. | 714/724 |
| 5,436,559 A     | 7/1995 | Takagi et al. ............ | 324/158.1 |
| 5,521,493 A  *  | 5/1996 | Persons .................... | 324/158.1 |
| 5,554,944 A  *  | 9/1996 | Van Buul et al. ............. | 327/91 |
| 6,211,723 B1 *  | 4/2001 | Creek ......................... | 327/494 |
| 6,232,815 B1    | 5/2001 | Turvey ....................... | 327/291 |

OTHER PUBLICATIONS

Patent Abstracts of Japan, European Patent Office, Publication No. 10082831, (Mar. 3, 1998).

Patent Abstracts of Japan, European Patent Office, Publication No. 05005770, (Jan. 14, 1993).

* cited by examiner

*Primary Examiner*—Vinh P. Nguyen

(57) ABSTRACT

An electrical test circuit includes a bridge configuration having two paths between two nodes, a buffer, and a capacitor. An output of the buffer is coupled to one of the paths, the buffer is adapted to either provide a defined potential or a high impedance, the capacitor is connected to the output of the buffer, and a signal of a device under test is adapted to be coupled to another one of the paths. One of the nodes of the bridge configuration can be supplied with a first current, and the other one of the nodes of the bridge configuration can be supplied with a second current.

11 Claims, 3 Drawing Sheets

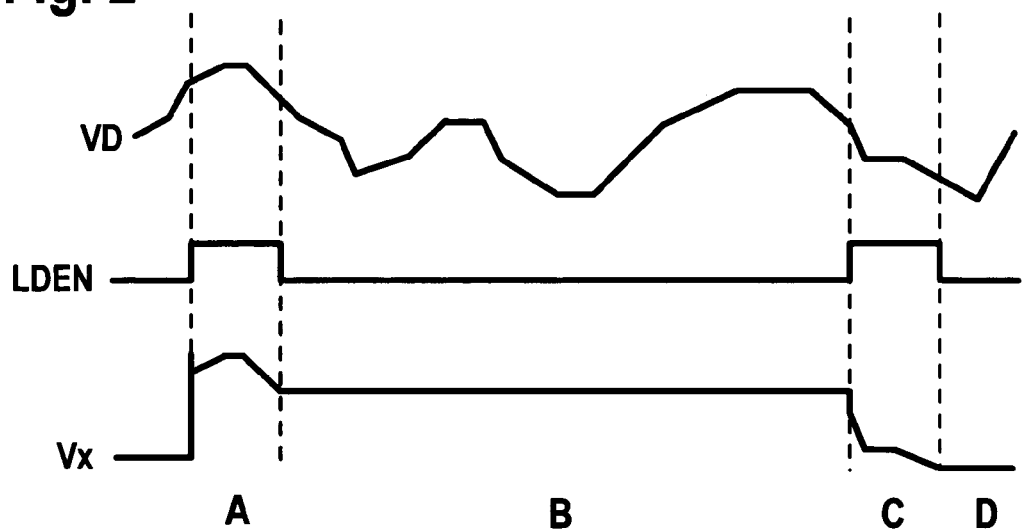
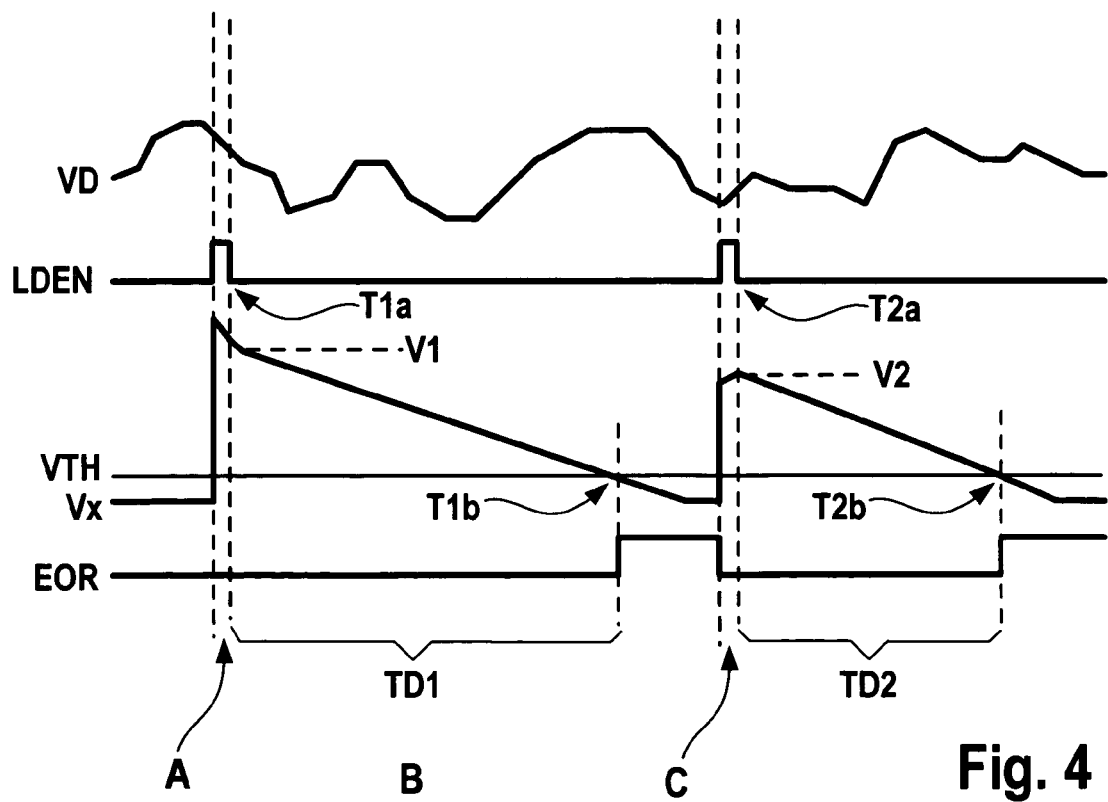

ELECTRICAL TEST CIRCUIT WITH AN ACTIVE-LOAD AND AN OUTPUT SAMPLING CAPABILITY

BACKGROUND OF THE INVENTION

1. Field of the Invention

The present invention is directed to an active load circuit for testing digital and analog signals.

2. Brief Description of Related Developments

So-called active-load circuits are often used within test systems for terminating signals of a device under test with a programmable current. Such test circuits are present e.g. on a plug-in card of the test systems. Such plug-in cards, however, are usually only applicable for digital signals of the device under test, and if an analog signal of the device under test is to be tested, different plug-in cards have to be applied.

SUMMARY OF THE INVENTION

It is an object of the invention to provide an improved active-load circuit. The object is solved by the independent claims. Preferred embodiments are shown by the dependent claims.

The circuit according to the present invention may be used for testing digital signals as well as analog signals. In connection with analog signals, the buffer is switched into its high impedance state and the value of the analog signal can be sampled with the help of the capacitor. The sampled voltage may then be converted into a digital value. As well, a time duration or a corresponding digital count value may be generated corresponding to the sampled voltage.

According to embodiments of the invention, an electrical test circuit with a bridge configuration comprises four diodes, wherein a common connection point of the anode and the cathode of two of the four diodes is connected with an output of a buffer, wherein a common connection point of the cathode and the anode of the two other diodes is coupled with a signal of a device under test, wherein a common connection point of the anodes of two of the four diodes may be supplied with a first current, wherein a common connection point of the cathodes of the other two diodes may be supplied with a second current. A capacitor is connected to the output of the buffer, and the buffer is provided to be switched into a high impedance state.

The term 'buffer' as used herein shall represent any kind of circuit allowing to either provide a defined potential or a high impedance to a node. Such buffer can be accomplished e.g. by standard buffer circuits as well known in the art, or by a switchable voltage source (e.g. a voltage source in series with a switch coupled to the node, so that with closed switch the voltage source is coupled to the node and with open switch the voltage source is decoupled from the node).

The bridge configuration can be any kind of circuit having a first and a second paths between a first and a second node. The first path having a third node and the second path having a forth node. In case a potential at the third node exceeds a potential at the forth node, a first current provided at the first node will be drawn at the forth node. In case the potential at the third node is lower than the potential at the forth node, a second current provided at the second node will be drawn at the forth node.

The invention can be partly or entirely embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawing(s). Features that are substantially or functionally equal or similar will be referred to with the same reference sign(s).

FIG. 2 shows a schematic time diagram of signals of the test circuit of FIG. 1, FIG. 4 shows a schematic time diagram of signals of the test circuit of FIG. 3.

MORE DETAILED DESCRIPTION OF PREFERRED EMBODIMENTS ACCORDING TO THE INVENTION

Figure 1:
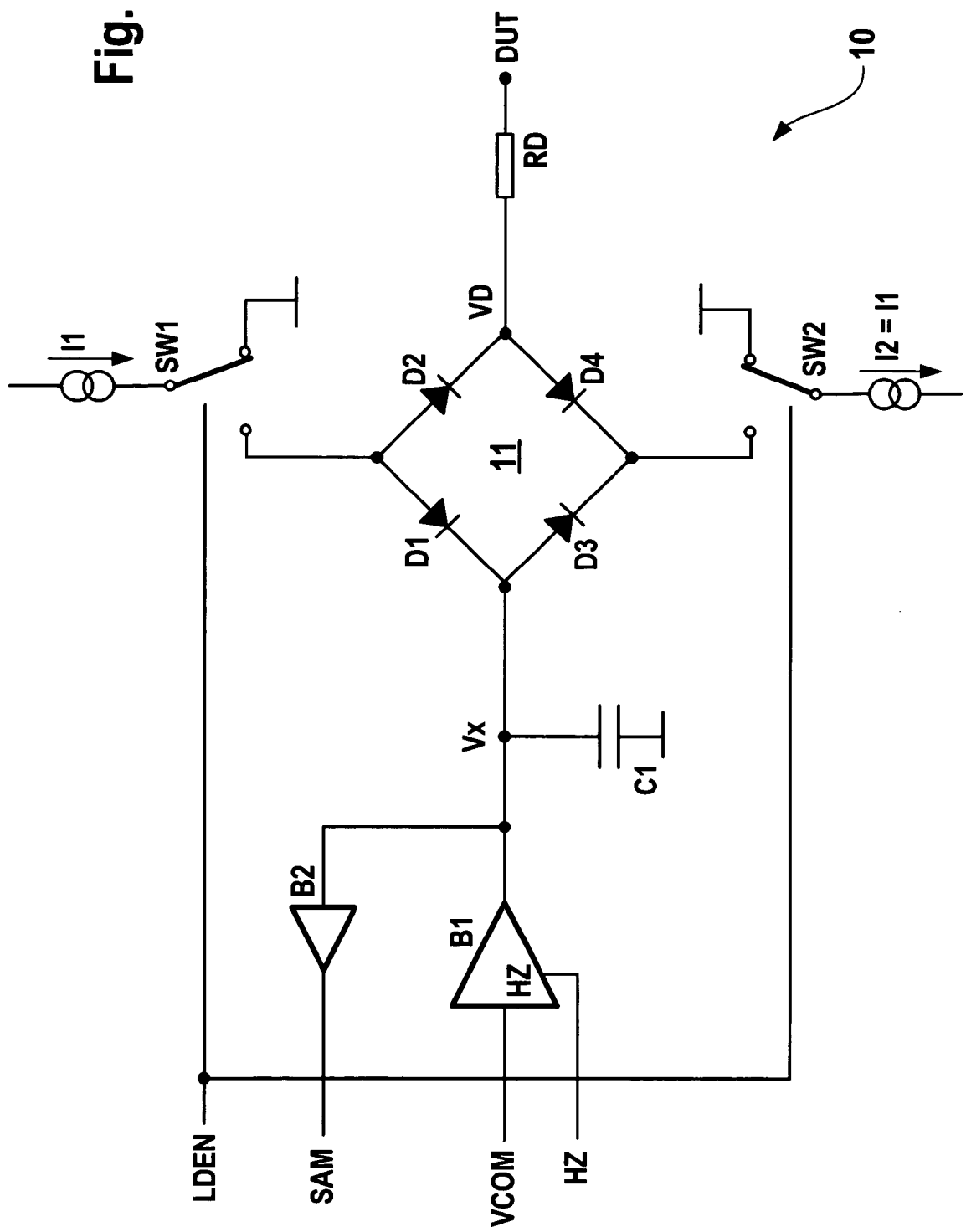
FIG. 1 shows a schematic circuit diagram of a first embodiment of an electric test circuit according to the invention.

In FIG. 1, a test circuit 10 is shown that may be part of a test system for testing digital and/or analog signals. The test circuit 10 may be implemented within a so-called pin-electronics chip, which may be mounted on a plug-in card of the test system. The test circuit 10 is a so-called active-load circuit and is provided for terminating one of the signals of the device under test with a programmable current.

The test circuit 10 comprises a bridge configuration 11 built up by four diodes D1, D2, D3, and D4. An output of a buffer B1 is connected with the common connection point of the cathode of the diode D1 and the anode of the diode D3. At this common connection point, a voltage Vx is present. The common connection point of the cathode of the diode D2 and the anode of the diode D4 is connected via a resistor RD with a pin DUT that carries the signal of the device under test (DUT). At this common connection point, a voltage VD is present.

The common connection point of the anodes of the diodes D1 and D2 is connected with a switch SW1, which is connected with a current source providing a current I1. In a first position of the switch SW1, the current I1 flows into the bridge configuration 11, whereas in a second position of the switch SW1 current flow into the bridge configuration 11 is disabled e.g. in that the current source is grounded.

The common connection point of the cathodes of the diodes D3 and D4 is connected with a switch SW2 which is connected with a current source providing a current I2. In a first position of the switch SW2, the current I2 flows out of the bridge configuration 11, whereas in a second position of the switch SW2 current flow into the bridge configuration 11 is disabled e.g. in that the current source is grounded.

At least in connection with the described testing of analog signals, the values of the currents I1 and I2 are preferably provided to be at least substantially identical. The switches SW1 and SW2 are switched by a signal LDEN preferably provided by the test system. Furthermore, the test system supplies a fixed voltage VCOM to an input of the buffer B1. This voltage VCOM defines a level for differentiating between a binary "1" and a binary "0" of the signal of the device under test, which is present at the pin DUT in case of testing digital signals.

If the signal LDEN is low or off, the switches SW1 and SW2 are grounded and do not connect the current sources with the bridge configuration 11. The test circuit 10, therefore, does not represent a load for the signal of the device under test.

If the signal LDEN is high or on, the switches SW1 and SW2 connect the current sources for the currents I1 and I2 with the bridge configuration 11. Therefore, the device under test being connected at the pin DUT is loaded by the current I2 if the voltage at the pin DUT is sufficiently higher than the voltage VCOM, and the device under test is loaded by the current −I1 if the voltage at the pin DUT is sufficiently lower than the voltage VCOM. The device under test being connected at pin DUT is therefore terminated with the currents I2 and −I1, depending on the voltage of the device under test.

The test circuit 10 furthermore comprises a capacitor C1 that is connected from the output of the buffer B1 to preferably ground. It is also possible that the capacitor C1 is built up by parasitic capacitances being present at the output of the buffer B1. The output of the buffer B1 is also connected to the input of a buffer B2, which provides a signal SAM at its output. The buffer B1 is provided with a control signal HZ that enables the buffer B1 to be switched into a high impedance state.

In FIG. 2, the voltages Vx and VD as well as the signal LDEN are shown over the time. For the following description, it is assumed that the buffer B1 is switched into its high impedance state.

If the signal LDEN is high or on, i.e. if the switches SW1 and SW2 connect the current sources to the bridge configuration 11, then the voltage Vx follows the voltage VD. This is shown in section A of FIG. 2. When the signal LDEN changes to low or off, then the last value of the voltage Vx before the change of the state of the signal LDEN will remain as the voltage Vx. This voltage Vx will remain substantially fixed due to the capacitor C1. This is shown in section B of FIG. 2.

The voltage Vx is preferably amplified by the buffer B2 and provided as the signal SAM. This signal SAM, therefore, is an analog value representing the voltage VD at the point in time at which the change of the state of the signal LDEN (from high to low, or on to off) took place. By switching the signal LDEN from on to off, the voltage VD may therefore be sampled. The resulting signal SAM may be provided to an analog/digital-converter in order to convert it into a digital value.

If the signal LDEN is high or on again, the voltage Vx follows the voltage VD again. By switching the signal LDEN off again, the sampling of the voltage VD results again in a new signal SAM, as illustrated above. This is shown in sections C and D of FIG. 2.

As a result, the test circuit 10 is able to create a sampled analog signal SAM of the signal of the device under test being connected at the pin DUT by switching the buffer B1 in a high impedance state and by switching the signal LDEN off. The sampled analog signal SAM thus represents the voltage VD at the point in time of switching the signal LDEN off.

Figure 3:
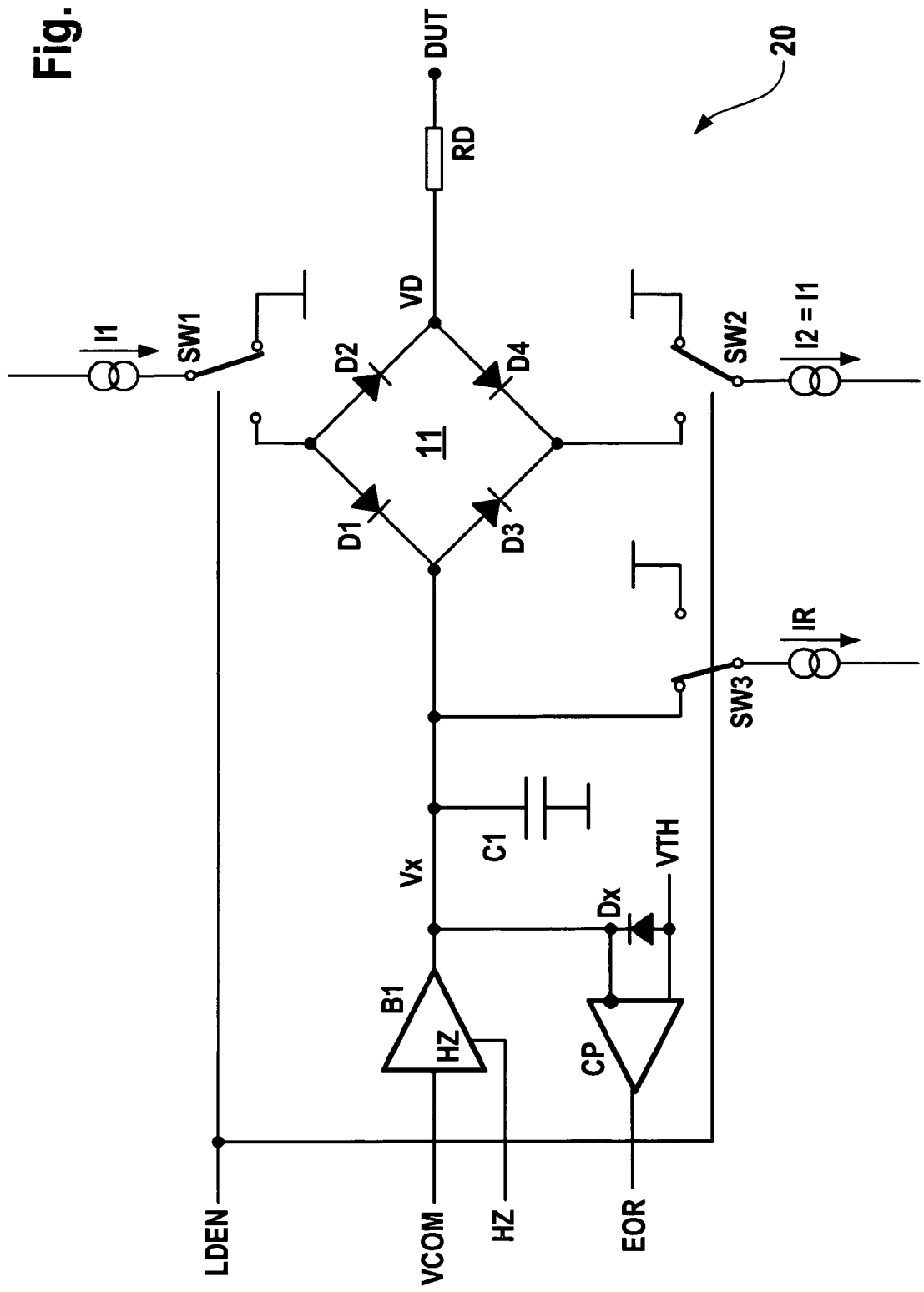
FIG. 3 shows a schematic circuit diagram of a second embodiment of an electric test circuit according to the invention.

In FIG. 3, a test circuit 20 is shown which is similar to the test circuit 10 of FIG. 1. Therefore, identical features are characterized by identical reference numerals. As well, reference is made to the description above.

Compared to the test circuit 10 of FIG. 1, the test circuit 20 of FIG. 3 does not comprise the buffer B2 and the signal SAM. Instead, the test circuit 20 of FIG. 3 comprises a switch SW3 that is connected with the output of the buffer B1 and with a current source for providing a current IR. In a first position of the switch SW3, the current source is preferably grounded. In a second position of the switch SW3, the current source for providing the current IR is connected with the output of the buffer B1. The switch SW3 is switched by the signal LDEN.

Furthermore, the output of the buffer B1 is connected with an (preferably inverted as shown in FIG. 3) input of a comparator CP. This (inverted) input is connected via a diode Dx with a (preferably non-inverted as shown in FIG. 3) input of the comparator CP. This (non-inverted) input is supplied with a threshold voltage VTH. The output of the comparator CP provides a digital signal EOR.

If the current IR is sufficiently smaller than the current I1, then the switch SW3 may be unnecessary, and the current I1 may be connected directly to the output of the buffer B1.

In FIG. 4, the voltages Vx and VD as well as the signals LDEN and EOR are shown over the time. For the following description, it is assumed that the buffer B1 is switched into its high impedance state.

If the signal LDEN is high or on, i.e. if the switches SW1 and SW2 connect the current sources to the bridge configuration 11 and if the switch SW3 grounds the current source for the current IR, then the voltage Vx follows the voltage VD. This is shown in section A of FIG. 4.

When the signal LDEN changes to low or off, then the signal Vx starts to decrease/increase from its last value V1 before the change of the state of the signal LDEN took place. The point in time of this change of the signal LDEN is characterized by reference sign T1a. The decrease/increase of the voltage Vx is linear like a ramp and is defined by the current IR and the capacitor C1. This is shown in section B of FIG. 4.

When the voltage Vx becomes equal to the threshold voltage VTH, the signal EOR changes from a binary "0" to a binary "1". This point in time is characterized by reference sign T1b. The time duration between the points in time T1a and T1b is characterized by reference sign TD1.

If the signal LDEN is switched on again, the signal EOR is set to a binary "0" again and the voltage Vx follows the voltage VD again. This is shown in section C of FIG. 4. As soon as the signal LDEN is switched off again, the described decrease of the voltage Vx starts again and the signal EOR changes from a binary "0" to a binary "1" again. This results in a time duration TD2 between the points in time T2a and T2b.

Due to the linear decrease of the voltage Vx, the time durations TD1 and TD2 correspond to the values V1 and V2 of the voltage Vx at the point in time at which the signal LDEN changes. These time durations TD1 and TD2 may then be forwarded to a period counter or other means for time-measurements, so that the time durations TD1 and TD2 are converted into digital count values.

As a result, the test circuit 20 is able to create time durations TD1 and TD2 from the signal of the device under test being connected at the pin DUT by switching the buffer B1 in a high impedance state and by switching the signal LDEN off. These time durations TD1 and TD2 may then be converted (e.g. into digital count values) corresponding to the values V1 and V2 of the voltage as sampled at the pin DUT in the points in time at which the signal LDEN is switched off.

What is claimed is:

1. An electrical test circuit comprising:
   a bridge configuration having two paths between two nodes,
   a buffer having an output coupled to one of the paths, wherein the buffer is adapted to either provide a defined potential or a high impedance, a capacitor connected to the output of the buffer, and a signal of a device under test—DUT—adapted to be coupled to another one of the paths, wherein one of the nodes of the bridge configuration is switchable connected to a first current source and the other one of the nodes of the bridge configuration is switchable connected to a second current source, wherein the test circuit operates in both an active-load mode and a sampling mode, and in the active-load mode, the output of the buffer provides a defined potential, the first current is provided to the device under test when the potential of the signal of the device under test is smaller than the potential at the output of the buffer, and the second current is provided to the device under test when the potential of the signal of the device under test exceeds the potential at the output of the buffer; and in the sampling mode, the output of the buffer provides a high impedance, and the course of the potential at the output of the buffer substantially follows the course of the potential of the signal of the device under test as long as the first and the second current are connected to the one node and other one node, respectively.

2. The electrical test circuit of claim 1, wherein the bridge configuration is adapted to provide the first current to the device under test in case the potential of the signal of the device under test is smaller than the potential at the output of the buffer, and to provide the second current to the device under test in case the potential of the signal of the device under test exceeds the potential at the output of the buffer.

3. The electrical test circuit of claim 1, wherein in the sampling mode, the potential at the output of the buffer is sampled substantially at the point in time the provision of the first and the second current is disabled.

4. The electrical test circuit of claim 1, wherein in the sampling mode, the first current and the second current have substantially equal values.

5. The electrical test circuit of claim 1, wherein an input of the buffer is supplied with a substantially fixed voltage adapted for defining a level for differentiating between logic states, preferably a binary "1" and a binary "0", of the digital signal of the device under test.

6. The electrical test circuit of claim 1, further comprising another buffer adapted to derive a value representing the potential at the output of the buffer.

7. The electrical test circuit of claim 1, wherein the output of the buffer is provided as a sampled analog signal of the signal of the device under test.

8. The electrical test circuit of claim 1, wherein a third current source for providing a current is adapted to be connected with the output of the buffer.

9. The electrical test circuit of claim 8, wherein a comparator is connected with the output of the buffer, wherein the comparator is supplied with a threshold voltage, and wherein the comparator provides a digital signal representing the sampled analog signal of the device under test.

10. The electrical test circuit of claim 1, wherein the bridge configuration comprises four diodes, the circuit comprising one or more of:

a common connection point of the anode and the cathode of two of the four diodes is connected with the output of the buffer, a common connection point of the cathode and the anode of the two other diodes is adapted to be coupled with the signal of the device under test, a common connection point of the anodes of two of the four diodes is adapted to be supplied with the first current, and a common connection point of the cathodes of the other two diodes is adapted to be supplied with the second current.

11. An electrical test circuit with a bridge configuration comprising four diodes, wherein:

a common connection point of the anode and the cathode of two of the four diodes is connected with an output of a buffer, a common connection point of the cathode and the anode of the two other diodes is coupled with a signal of a device under test, a common connection point of the anodes of two of the four diodes is switchably supplied with a first current, a common connection point of the cathodes of the other two diodes is switchably supplied with a second current, a buffer is provided having an output that is switchable to a high impedance state, and a capacitor is connected to the output of the buffer, wherein the electrical test circuit operates in both an active-load mode and a sampling mode, and in the active-load mode, the output of the buffer provides a defined potential, the first current is provided to the device under test when the potential of the signal of the device under test is smaller than the potential at the output of the buffer, and the second current is provided to the device under test when the potential of the signal of the device under test exceeds the potential at the output of the buffer; and in the sampling mode, the output of the buffer is switched to a high impedance, and the course of the potential at the output of the buffer substantially follows the course of the potential of the signal of the device under test as long as the first current is supplied to the common connection point of the anodes of the two of the four diodes, and the second current is supplied to the common connection point of the cathodes of the other two diodes.

* * * * *

UNITED STATES PATENT AND TRADEMARK OFFICE
CERTIFICATE OF CORRECTION

PATENT NO. : 7,129,695 B2 Page 1 of 1
APPLICATION NO. : 10/864123
DATED : October 31, 2006
INVENTOR(S) : Bernard Roth It is certified that error appears in the above-identified patent and that said Letters Patent is hereby corrected as shown below:

On the title page (76), delete "158" and insert therefore --15--.

Signed and Sealed this

Second Day of January, 2007

JON W. DUDAS
*Director of the United States Patent and Trademark Office*